(12) United States Patent
Cho et al.

(10) Patent No.: US 6,944,943 B2
(45) Date of Patent: Sep. 20, 2005

(54) SURFACE MOUNTER FOR MOUNTING COMPONENTS

(75) Inventors: Tae-yeon Cho, Seongnam-si (KR); Seong-i Lee, Seongnam-si (KR)

(73) Assignee: Samsung Techwin Co., Ltd (KR)

( * ) Notice: Subject to any disclaimer, the term of this patent is extended or adjusted under 35 U.S.C. 154(b) by 0 days.

(21) Appl. No.: 10/460,001

(22) Filed: Jun. 12, 2003

(65) Prior Publication Data

US 2003/0230838 A1 Dec. 18, 2003

(30) Foreign Application Priority Data

Jun. 12, 2002 (KR) .................................. 10-2002-0032847

(51) Int. Cl.[7] .............................................. H05K 3/30
(52) U.S. Cl. .............................. 29/740; 29/739; 29/759; 29/760; 29/33 P; 198/468.01; 414/752.1; 414/751.1
(58) Field of Search ......................... 29/740, 786, 760, 29/732, 832, 833, 33 K, 33 P; 414/224.04; 198/341, 345, 346.2, 502.2, 817

(56) References Cited

U.S. PATENT DOCUMENTS 5,495,661 A * 3/1996 Gromer et al. ............... 29/740
5,517,748 A * 5/1996 Park ............................. 29/741
6,460,692 B2 * 10/2002 Dionne et al. ........... 198/836.3
6,643,917 B1 * 11/2003 Gieskes ....................... 29/740

FOREIGN PATENT DOCUMENTS

KR          1998-084253          12/1998

* cited by examiner

Primary Examiner—Minh Trinh
(74) Attorney, Agent, or Firm—St. Onge Steward Johnston & Reens LLC

(57) ABSTRACT

A surface mounter includes: a component supply unit in which a plurality of components to be mounted are placed; a head unit which mounts a component on a circuit board by lifting the component from the component supply unit with suction; and a transfer unit including a carry-in portion with a single distribution lane, a mounting portion with dual working lanes, and a carry-out portion with a single carry-out lane, wherein a circuit board is transferred along the distribution lane and distributed to the mounting portion, components are mounted on the circuit board stopped at a position of the mounting portion, and the circuit board with the components mounted thereon is transferred out of the transfer unit along the carry-out lane. In the surface mounter, a number of circuit boards can be distributed to dual working lanes via a single distribution lane, not via common dual carry-in lanes, at higher working speed, so that working efficiency is improved. In addition, the surface mounter occupies less space.

13 Claims, 5 Drawing Sheets

SURFACE MOUNTER FOR MOUNTING COMPONENTS

CROSS-REFERENCES TO RELATED APPLICATIONS

This application claims priority from Korean Patent Application No. 2002-32847, filed on Jun. 12, 2002, in the Korean Intellectual Property Office, the disclosure of which is incorporated herein in its entirety by reference.

BACKGROUND OF THE INVENTION

1. Field of the Invention

The present invention relates to an apparatus and method of mounting various kinds of electronic chips or device components on a printed circuit board (PCB), and more particularly, to an apparatus and method of mounting components with higher working and space-utilization efficiency.

2. Description of the Related Art

In general, chip mounters or surface mounters are used to mount semiconductors or other kinds of electronic chips and/or components (hereinafter referred to as "chip", "chips", "component", or "components") at predetermined positions on a printed circuit board (hereinafter referred to as "PCB" or PCBs"). For the mounting, a PCB is transferred to a mounting position by a transfer unit, and then a plurality of components placed on a chip tray are lifted with suction applied from a suction nozzle of a mounting head that is vertically and horizontally moved and mounted at proper positions on the PCB.

FIGS. 1 and 2 are plan views of exemplary conventional surface mounters, in which FIG. 1 illustrates a surface mounter with a single lane, and FIG. 2 illustrates a surface mounter with dual lanes.

Referring to FIG. 1, this conventional-type surface mounter with a single lane includes a single lane 11, a transfer unit 10 which moves along the single lane 11 to transfer PCBs $P_1$, $P_2$, and $P_3$, a component supply unit 20 which selectively supplies components using a plurality of component feeders 21, and a head unit 30 which has a mounting head 31 with a suction nozzle 32 for mounting a surface on PCB $P_2$ by lifting or picking it with suction applied from the suction nozzle 32.

In this surface mounter, PCB $P_1$, which is a bare PCB without any components thereon, moves along the single lane 11 and stops at a mounting position, while components previously mounted on PCB $P_2$, at the mounting position by the head unit 30 are transferred outwards from the single lane 11 and stops at the position where PCB $P_3$ was previously located.

A conventional surface mounter with dual lanes (FIG. 2) differs from the surface mounter with a single lane 11 in that it includes a pair of parallel dual lanes 11a and 11b. In FIG. 2, elements that are the same as in FIG. 1 are denoted by the same reference numerals, and thus descriptions thereon will not be repeated here.

Such a surface mounter with dual lanes offers a superior working speed and mounting efficiency that is substantially the same as when using two single-lane surface mounters. However, the surface mounter with dual lanes has a complicated structure and occupies a larger space because its dual-lane PCB transferring areas and component mounting areas take the space.

SUMMARY OF THE INVENTION

The present invention provides a surface mounter which occupies less space and offers improved component mounting efficiency, and also a method of mounting components using the same.

In accordance with an aspect of the present invention, there is provided a surface mounter for mounting a component on a circuit board. The surface mounter comprises: a component supply unit for supplying a component to be mounted on the circuit board; a mounting unit for mounting the component supplied by the component supply unit on the circuit board; and a transfer unit including a carry-in portion with a single distribution lane, and a mounting portion with plural working lanes, the transfer unit being configured to transfer the circuit board along the distribution lane of the carry-in portion and thereafter to distribute to the mounting portion through the working lanes thereof for mounting the component by the mounting unit. Preferably, the surface mounter further includes a carry-out portion with a single carry-out lane for transferring the circuit board from the mounting portion of the transfer unit.

In accordance with another aspect of the present invention, there is provided a method of mounting a component on a circuit board. The method comprises the steps of: providing a surface mounter for mounting a component on a circuit board having a width, the surface mounter including a single distribution lane, plural working lanes, and a single carry-out lane; checking whether the width of the circuit board matches each of the widths of the distribution lane, the working lanes, and the carry-out lane of the surface mounter; adjusting each of the widths of the distribution lane, the working lanes, and the carry-out lane to correspond to the width of the circuit board if they do not respectively match the width of the circuit board; loading the circuit board onto the distribution lane; distributing the circuit board to one of the working lanes; mounting a component on the circuit board distributed to the working lane; and transferring the circuit board with the component mounted thereon along and out of the carry-out lane.

BRIEF DESCRIPTION OF THE DRAWINGS

The above and other features and/or objectives of the present invention will become more apparent by the following exemplary embodiments thereof with reference to the attached drawings in which.

DETAILED DESCRIPTION OF THE INVENTION

Preferred embodiments of the present invention are herein described in detail with reference to the appended drawings.

Figure 1:
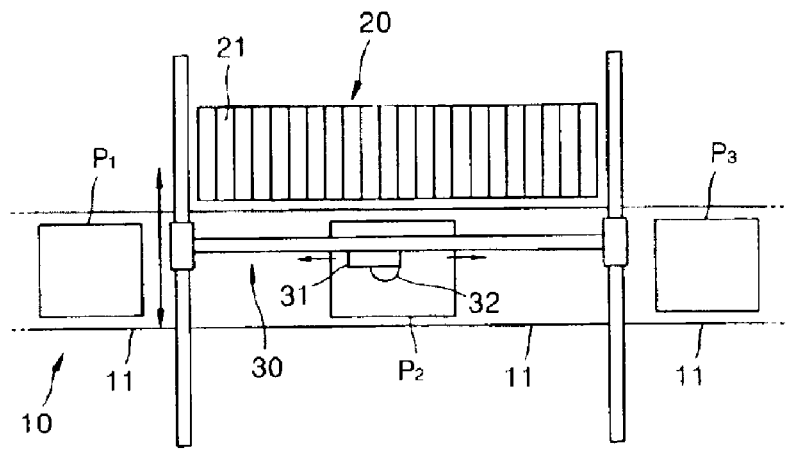
FIG. 1 is a schematic plan view of a conventional surface mounter with a single lane.
Figure 2:
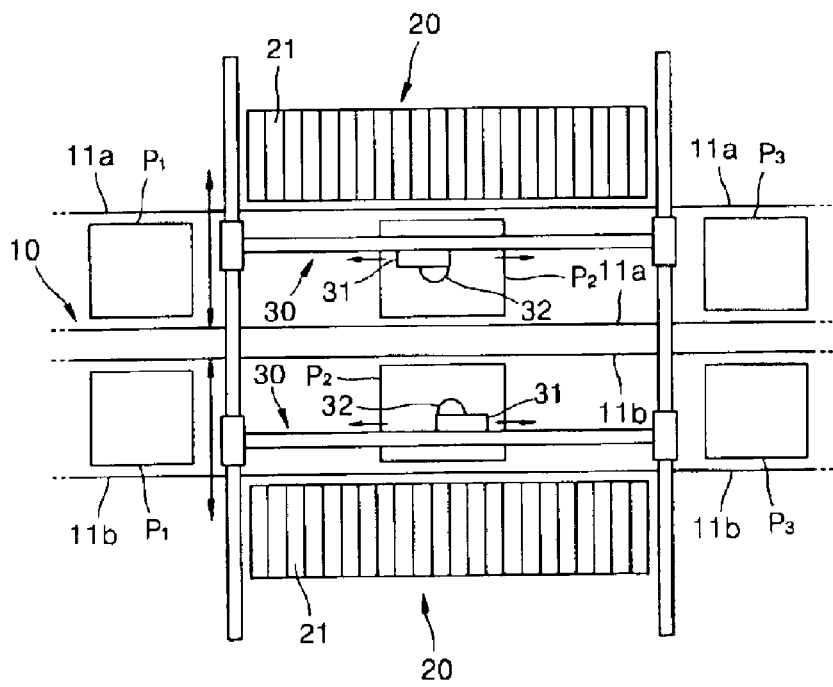
FIG. 2 is a schematic plan view of a conventional surface mounter with dual lanes.
Figure 3:
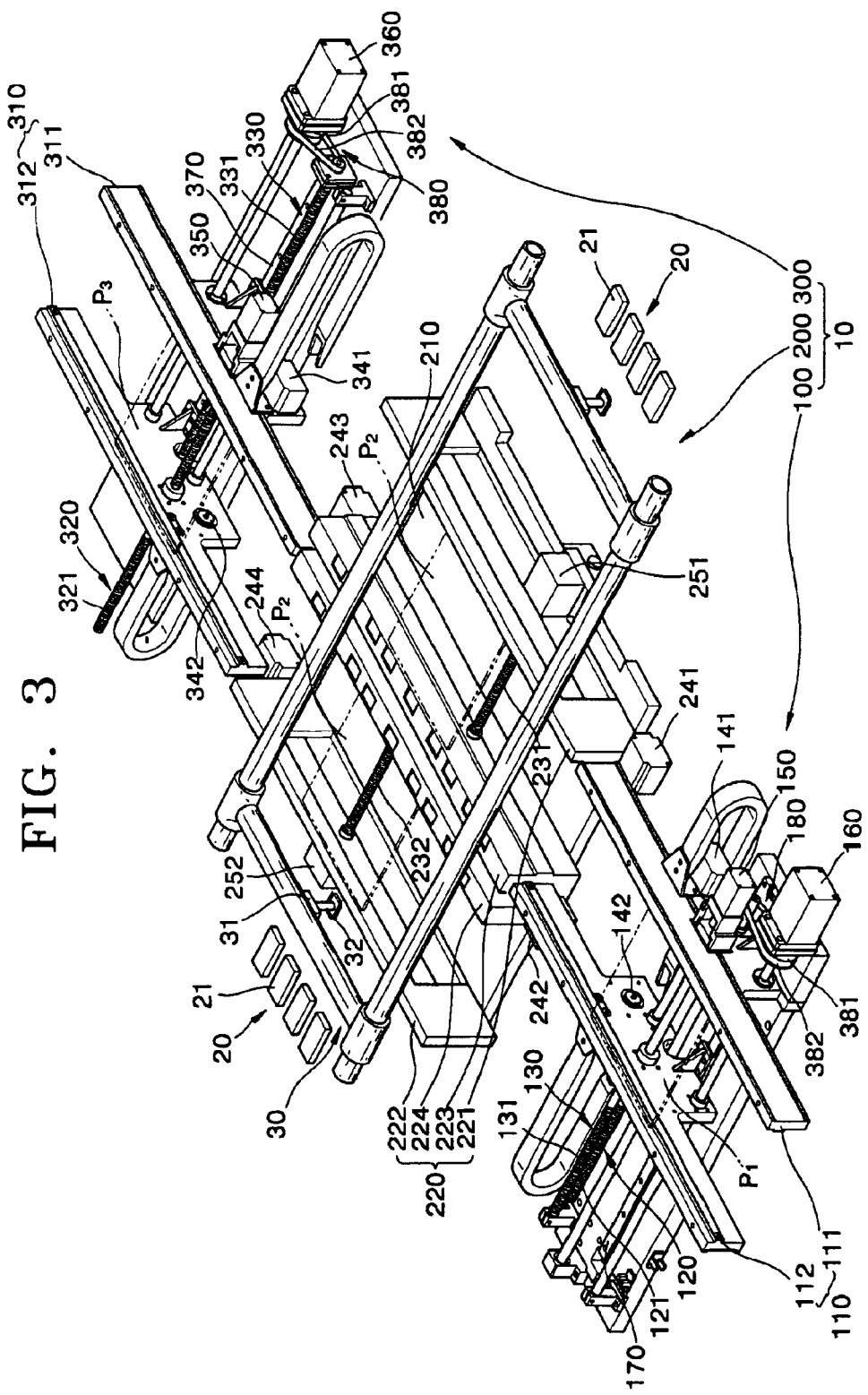
FIG. 3 is a perspective view of a surface mounter according to an embodiment of the present invention.
Figure 4:
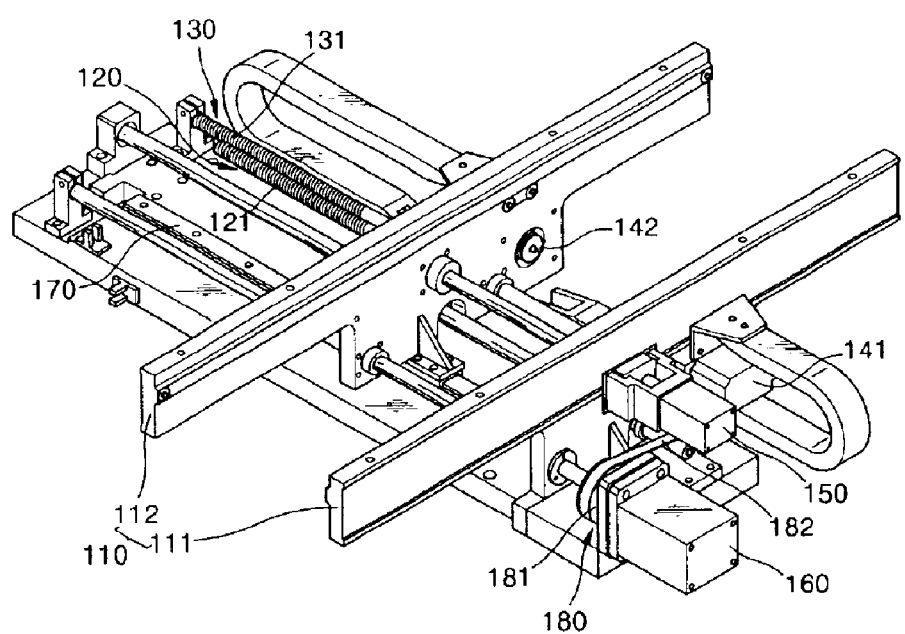
FIG. 4 is a view illustrating a carry-in portion of the transfer unit of FIG. 3.

FIG. 3 is a perspective view of a surface mounter according to an embodiment of the present invention, and FIG. 4 is an enlarged view of a carry-in portion of a transfer unit in FIG. 3.

Referring to FIGS. 3 and 4, the surface mounter according to an embodiment of the present invention includes a transfer unit 10 which transfers electronic circuit boards (PCBs) $P_1$, $P_2$, and $P_3$ to a mounting position, a component supply unit 20 which selectively supplies components using a plurality of component feeders 21, and a head unit 30 which has a mounting head 31 with a suction nozzle 32 for mounting a component (or a plurality of components) on PCB $P_2$ by lifting or picking up the component with suction applied from the suction nozzle 32.

The transfer unit 10 includes a carry-in portion 100 with a single distribution lane 110 along which PCB $P_1$ is transported, a mounting portion 200 with parallel dual working lanes 210 along which PCB $P_2$ is transferred and stopped at a position to allow components to be mounted thereon and along which PCB $P_3$ with the components mounted thereon is transferred there-from, and a carry-out portion 300 with a single carry-out lane 310 along which PCB $P_3$ carried from the mounting portion 200 is transferred out. It is envisioned that the mounting portion 200 may include more than two working lanes 210 each with a similar structure which will be further described in details.

It is preferable that the carry-in portion 100 and the carry-out portion 300 have the same structure for compatibility. Referring to FIG. 3, the distribution lane 110 and the carry-out lane 310 respectively include width adjusting rails 111 and 311 extending in a transfer direction of PCBs $P_1$, $P_2$, and $P_3$ and lane shifting rails 112 and 312, which are parallel to the width adjusting rails 111 and 311.

The mounting portion 200 includes: a base 210; first and second fixed rails 221 and 222 which are fixed to each side of the base 210 and extends in the transfer direction of PCBs $P_1$, $P_2$, and $P_3$ parallel to each other; and first and second movable-rails 223 and 224 which are installed parallel to the first and second fixed rails 221 and 222 and to be movable in a direction perpendicular to the transfer direction of PCBs $P_1$, $P_2$, and $P_3$.

Each of the carry-in portion 100 and the carry-out portion 300 may further comprise a lane width adjusting unit and a lane shifting unit. The lane width adjusting unit adjusts the width of the distribution lane 110 and the carry-out lane 310, i.e., the distance between the width adjusting rails 111 and 311 and the respective lane shifting rails 112 and 312 to correspond to the width of PCB $P_1$ on which a component is to be mounted. The lane shifting unit shifts the width adjusting rails 111 and 311 and the lane shifting rails 112 and 312 simultaneously, without changing the distance therebetween, in a direction perpendicular to the transfer direction of PCBs $P_1$, $P_2$, and $P_3$. The mounting portion 200 may further include a movable-rail shifting unit which shifts the first and second movable-rails 223 and 224 in a direction perpendicular to the transfer direction of PCBs $P_1$, $P_2$, and $P_3$ such that the width of the working lanes 210 corresponds to the width of PCB $P_1$.

Each lane width adjusting unit includes a width adjusting screw 120 (320) with a width adjusting threaded portion 121 (321), which is rotatably coupled to the width adjusting rail 111 (311) for shifting the width adjusting rail 111 (311) with respect to the lane shifting rail 112 (312) when turned, and a width adjusting motor 150 (350) which actuates the width adjusting screw 120 (320). Each lane shifting unit includes a lane shifting screw 130 (330) with a lane shifting threaded portion 131 (331), which is rotatably coupled to the lane shifting rail 112 (312) for shifting the width adjusting rail 111 (311) and the lane shifting rail 112 (311) simultaneously when turned, and a lane shifting motor 160 (360) which actuates the lane shifting screw 130 (330). The actuating force of the lane shifting motor 160 (360) is transmitted to the lane shifting screw 130 (330) via a pulley-belt assembly 180 (380) which includes a pulley 181 (380) and a belt 182 (382). The movable-rail shifting unit of the mounting portion 200 includes first and second movable-rail shifting screws 231 and 232 and first and second movable-rail shifting motors 251 and 252. The first and second movable-rail shifting screws 231 and 232 are respectively coupled to the first and second movable-rails 223 and 224 and shift the first and second movable-rails 223 and 224 with respect to the first and second fixed rails 221 and 222 when turned. The first and second movable-rail shifting motors 251 and 252 respectively actuate the first and second movable-rail shifting screws 231 and 132.

The carry-in portion 100 and the carry-out portion 300 may further include rail shifting guides 170 and 370, respectively, which are coupled to the width adjusting rails 111 and 311 and the lane shifting rails 112 and 312 to slidably guide their shifting. Reference numerals 141, 142, 241, 242, 243, 244, 341, and 342 denote conveyer belt driving motors.

The operation of the surface mounter generally having the above-mentioned structure is herein described in detail with reference to FIGS. 5 and 6.

Figures 5, 6:
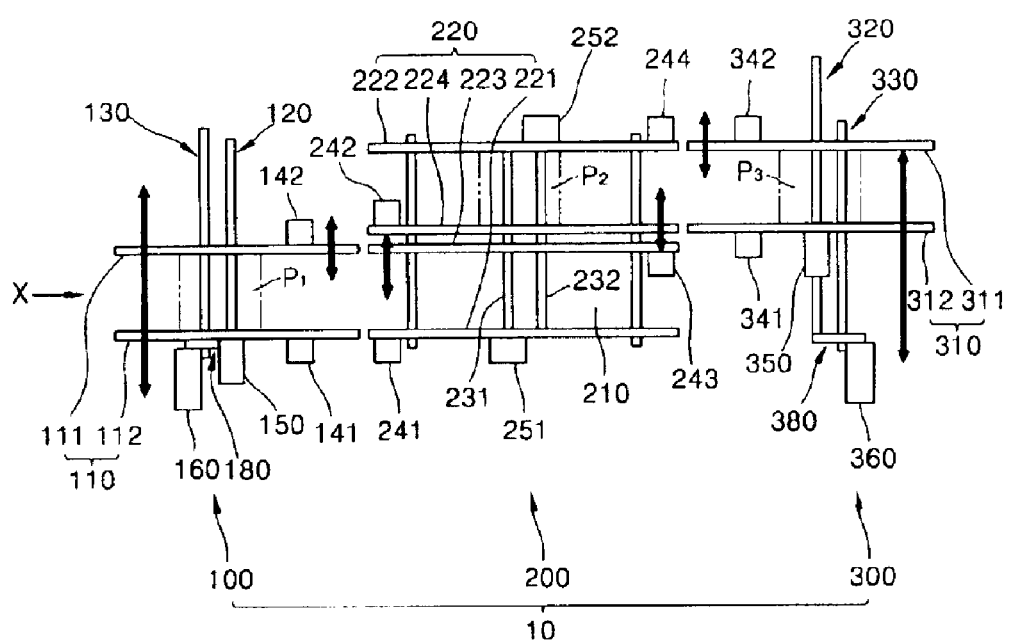
FIG. 5 is a plan view of the transfer unit of FIG. 3.
FIG. 6 is a side view of the transfer unit of FIG. 5 shown in X-direction.

FIG. 5 is a plan view of the transfer unit of the surface mounter of FIG. 3, and FIG. 6 is a side view of the transfer unit of FIG. 5 shown in X-direction.

Referring to FIG. 5, when PCB $P_1$ on which a component is to be mounted is prepared, the width of the distribution lane 110, the working lanes 210, and the carry-out lane 310 is respectively adjusted.

In particular, in the carry-in portion 100 and the carry-out portion 300, the width adjusting motors 150 and 350 are operated to turn the width adjusting screws 120 and 320 and shift the width adjusting rails 111 and 311 in a direction perpendicular to the transfer direction of PCBs $P_1$, $P_2$, and $P_3$, so that the width of the distribution lane 110 and the carry-out lane 310 is adjusted. In the mounting portion 200, the first and second movable-rail shifting motors 251 and 252 are operated to screw the first and second movable-rail shifting screws 231 and 232 and shift the first and second movable-rails 223 and 224 in a direction perpendicular to the transfer direction of PCBs $P_1$, $P_2$, and $P_3$, so that the width of the working lanes 220 is adjusted.

After the width of the distribution lane 110, the working lanes 220, and the carry-out lane 310 is adjusted to correspond to the width of PCB $P_1$, PCB $P_1$ is loaded onto the distribution lane 110 and distributed to a working lane 220. In particular, the lane shifting motor 160 is operated to screw the lane shifting screw 130 and shift the width adjusting rail 111 and the lane shifting rail 112 simultaneously in a direction perpendicular to the transfer direction of PCBs $P_1$, $P_2$, and $P_3$ in order to line up the distribution lane 110 with one of the parallel dual working lanes 220 and allow PCB $P_1$ carried along the distribution lane 110 to be distributed to the working lane 220.

After PCB $P_2$ is distributed to the working lane 220 and comes to a stop, components are mounted onto PCB $P_2$. PCB $P_3$ with the components previously mounted thereon is transferred to the carry-out lane 310. In particular, the lane shifting motor 360 of the carry-out portion 300 is operated to screw the lane shifting screw 330 and shift the width adjusting rail 311 and the lane shifting rail 312 simultaneously in a direction perpendicular to the transfer direction of PCBs $P_1$, $P_2$, and $P_3$ in order to line up the carry-out lane 310 with the working lane 220 where the components are mounted on PCB $P_3$ and allow PCB $P_3$ to be transferred along and out of the carry-out lane 310. As a result, the operation of mounting components onto PCB $P_1$ is terminated.

Figure 7:
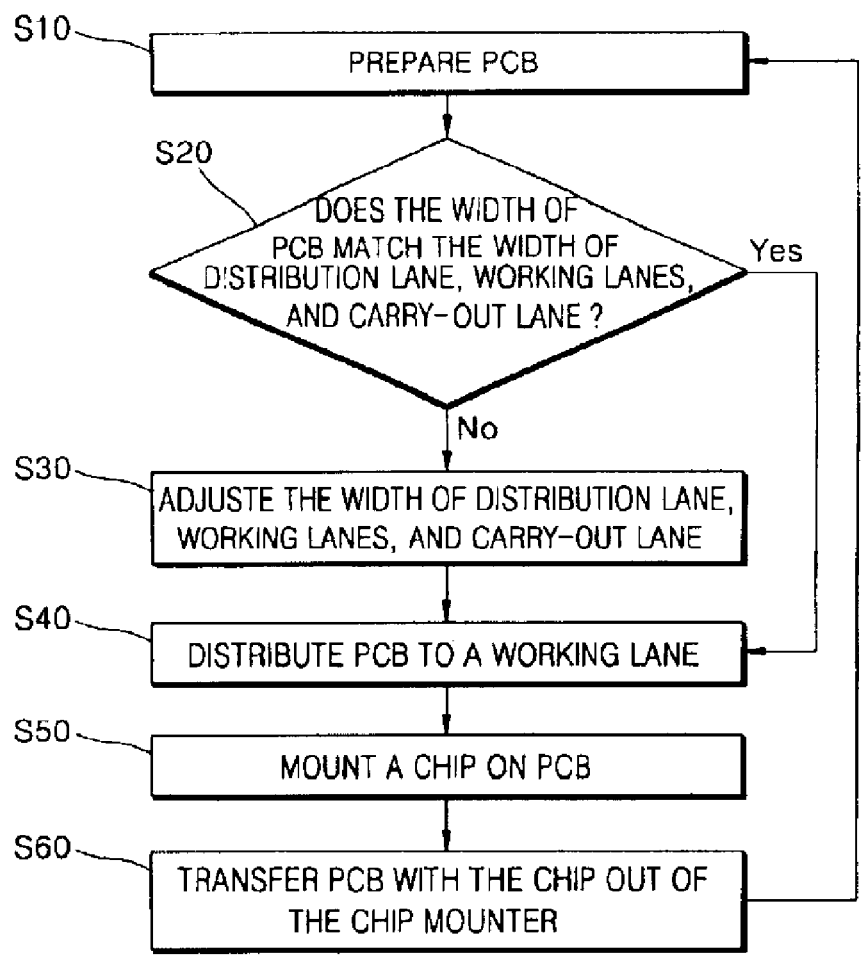
FIG. 7 is a flowchart illustrating a method of mounting components according to an embodiment of the present invention.

A method of mounting components on a PCB according to an embodiment of the present invention is now described in detail with reference to FIGS. 5 and 7.

Initially, PCB $P_1$ on which a component is to be mounted is prepared in step S10. Next, it is checked whether the width of PCB $P_1$ matches the width of the distribution lane 110, the working lanes 220, and the carry-out lane 310 (step S20).

If the width of PCB $P_1$ does not match the width of the distribution lane 110, the working lanes 220, and the carry-out lane 310, the width of the distribution lane 110, the working lanes 220, and the carry-out lane 310 is adjusted to correspond to the width of PCB $P_1$ (step S30). Step S30 can be skipped if the width of PCB $P_1$ matches the width of the distribution lane 110, the working lanes 220, and the carry-out lane 310.

The way to adjust the width of the distribution lane 110, the working lanes 220, and the carry-out lane 310 is described in the previous embodiment, and thus a description thereon will not be repeated here.

After the width of the distribution lane 110, the working lanes 220, and the carry-out lane 310 has been adjusted, PCB $P_1$ is loaded onto the distribution lane 110 of the carry-in portion 100 and distributed to a working lane 220 (step S40).

After PCB $P_2$ is distributed to the working lane 220 and comes to a stop, a component is mounted on PCB $P_2$ (step S50) by a manner known in the art. A plurality of components may also be mounted utilizing multiple component feeders 21.

Then, PCB $P_2$ with the component mounted thereon is transferred to the carry-out lane 310. At the same time, PCB $P_3$ with the component previously mounted thereon is transferred along and out of the carry-out lane 310, thereby terminating one cycle of the component mounting process. Next, the process returns to step S10 to mount a component on another PCB $P_1$.

A surface mounter having the above structure and a component mounting method using the same according to the present invention offer the following effects and/or advantages.

First, PCBs on which components are to be mounted can be distributed to plural (e.g., dual) working lanes via a single distribution lane with the same production speed and efficiency as when the components are distributed to the working lanes via dual lanes as in a conventional dual-lane surface mounter.

Second, the surface mounter according to the present invention occupies less space than conventional dual-lane surface mounters.

Third, the mounting portion of the surface mounter according to the present invention can be used in connection with dual carry-in and/or carry-out lanes as well as a single carry-in and/or carry-out lane. The surface mounter according to the present invention is compatible with various types of surface mounters.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A surface mounter for mounting components on a circuit board, comprising:
   a component supply unit for supplying a component to be mounted on the circuit board;
   a mounting unit for mounting the component supplied by the component supply unit on the circuit board; and
   a transfer unit including a carry-in portion with a single distribution lane, and a mounting portion with plural working lanes, the distribution lane having a width adjusting rail extending in a transfer direction of the circuit board and a lane shifting rail installed parallel to the width adjusting rail, the transfer unit having a lane width adjusting unit for adjusting the distance between the width adjusting rail and the lane shifting rail to correspond to the width of the circuit board, the transfer unit being configured to transfer the circuit board along the distribution lane of the carry-in portion and thereafter to distribute to the mounting portion through the working lanes thereof for mounting the component by the mounting unit.

2. The surface mounter of claim 1, further including a carry-out portion with a single carry-out lane for transferring the circuit board from the mounting portion of the transfer unit.

3. The surface mounter of claim 2, wherein the mounting portion of the transfer unit includes two working lanes.

4. The surface mounter of claim 2, wherein each of the distribution lane, the working lanes, and the carry-out lane is adapted to receive circuit boards with various widths.

5. The surface mounter of claim 4, wherein the carry-out lane includes a width adjusting rail extending in a transfer direction of the circuit board and a lane shifting rail installed parallel to the width adjusting rail.

6. The surface mounter of claim 5, wherein the carry-out portion further includes a lane width adjusting unit for adjusting the distance between the width adjusting rail and the lane shifting rail to correspond to the width of the circuit board, and each of the carry-in portion and the carry-out portion further includes a lane shifting unit for shifting the width adjusting rail and the lane shifting rail simultaneously, without changing the distance therebetween, in a direction perpendicular to the transfer direction of the circuit board.

7. The surface mounter of claim 6, wherein each of the lane width adjusting units of the carry-in portion and the carry-out portion respectively includes a width adjusting screw which is rotatably coupled to the width adjusting rail and shifts the width adjusting rail with respect to the lane shifting rail when turned, and a width adjusting motor which actuates the width adjusting screw.

8. The surface mounter of claim 7, wherein each of the lane shifting units of the carry-in portion and the carry-out portion respectively includes a lane shifting screw which is rotatably coupled to the lane shifting rail and shifts the width adjusting rail and the lane shifting rail simultaneously when turned, and a lane shifting motor which actuates the lane shifting screw.

9. The surface mounter of claim 4, wherein the working lanes include a base, first and second fixed rails which are fixed at each side of the base and extend in the transfer direction of the circuit board parallel to each other, and first and second movable-rails which are installed between and parallel to the first and second fixed rails to be movable in a direction perpendicular to the transfer direction of the circuit board.

10. The surface mounter of claim 9, wherein the mounting portion further includes a movable-rail shifting unit for shifting the first and second movable-rails simultaneously in a direction perpendicular to the transfer direction of the circuit board such that the width of the working lanes corresponds to the width of the circuit board.

11. The surface mounter of claim 10, wherein the movable-rail shifting unit includes first and second movable-rail transfer screws which are respectively coupled to the first and second movable-rails and shift the first and second movable-rails with respect to the first and second fixed rails when turned, and first and second movable-rail shifting motors which respectively actuate the first and second movable-rail transfer screws.

12. The surface mounter of claim 6, wherein each of the carry-in portion and the carry-out portion further includes a rail shifting guide which is coupled to the width adjusting rail and the lane shifting rail to slidably guide their shifting.

13. The surface mounter of claim 2, wherein the carry-in portion and the carry-out portion have generally the same structure.

* * * * *